United States Patent
Nakano et al.

(10) Patent No.: US 6,750,614 B2
(45) Date of Patent: Jun. 15, 2004

(54) PLASMA PROCESSING APPARATUS CAPABLE OF PERFORMING UNIFORM PLASMA TREATMENT BY PREVENTING DRIFT IN PLASMA DISCHARGE CURRENT

(75) Inventors: Akira Nakano, Miyagi-ken (JP); Tadahiro Ohmi, 2-1-17-301 Komegafukuro, Aoba-ku, Sendai-shi, Miyagi-ken (JP)

(73) Assignees: ALPS Electric Co. Ltd., Tokyo (JP); Tadahiro Ohmi, Sendai ( * ) Notice: Subject to any disclaimer, the term of this patent is extended or adjusted under 35 U.S.C. 154(b) by 0 days.

(21) Appl. No.: 10/348,934

(22) Filed: Jan. 21, 2003

(65) Prior Publication Data
US 2003/0137249 A1 Jul. 24, 2003

(30) Foreign Application Priority Data

Jan. 24, 2002 (JP) .......................... 2002-016035
Jan. 30, 2002 (JP) .......................... 2002-022322

(51) Int. Cl.[7] ................................. H05H 1/46
(52) U.S. Cl. ...................... 315/111.21; 315/111.51; 156/345.48; 118/723
(58) Field of Search ................. 315/111.21, 111.41, 315/111.51, 111.81, 111.91; 118/723, 723 E, 723 I, 723 ER; 204/192.1, 192.25; 156/345, 345.48

(56) References Cited

U.S. PATENT DOCUMENTS

| | | | | |
|---|---|---|---|---|
| 6,155,202 A | * | 12/2000 | Nakano et al. | 118/723 E |
| 6,252,354 B1 | * | 6/2001 | Collins et al. | 315/111.51 |
| 6,337,292 B1 | * | 1/2002 | Kim et al. | 438/787 |
| 6,652,717 B1 | * | 11/2003 | Hong | 204/192.25 |
| 2002/0185228 A1 | * | 12/2002 | Chen et al. | 156/345.48 |

* cited by examiner

Primary Examiner—Don Wong
Assistant Examiner—Jimmy T. Vu
(74) Attorney, Agent, or Firm—Beyer Weaver & Thomas

(57) ABSTRACT

A plasma processing apparatus has a plasma processing chamber that accommodates an electrode pair of a plasma excitation electrode for exciting plasma and a susceptor electrode facing the plasma excitation electrode, a workpiece to be treated being placed therebetween. The apparatus also has a chassis that accommodates an impedance matching circuit, provided in the middle of a supply path for feeding RF power from an RF generator to the plasma excitation electrode, for matching the impedance between the RF generator and the plasma processing chamber. In the chassis, impedances are axisymmetrically equal at a predetermined frequency with respect to the direction of a high-frequency current returning to the RF generator. The matching circuit has at least two inductance coils connected in parallel.

22 Claims, 12 Drawing Sheets

PLASMA PROCESSING APPARATUS CAPABLE OF PERFORMING UNIFORM PLASMA TREATMENT BY PREVENTING DRIFT IN PLASMA DISCHARGE CURRENT

BACKGROUND OF THE INVENTION

1. Field of the Invention

The present invention relates to plasma processing apparatuses. More particularly, it relates to a plasma processing apparatus which, during plasma discharge, is capable of preventing drift of a discharge current that flows through a gap between electrodes of an electrode pair and further is capable of increasing the effective electrical power in a plasma space.

2. Description of the Related Art

FIG. 13 shows a typical plasma processing apparatus heretofore used for plasma treatment such as chemical vapor deposition (CVD), sputtering, dry etching, and ashing. The plasma processing apparatus in FIG. 13 has an electrode pair which includes a plasma excitation electrode 4 for exciting plasma and a susceptor electrode 8 facing the plasma excitation electrode 4. A workpiece W to be plasma-treated is placed between the plasma excitation electrode 4 and the susceptor electrode 8. The plasma excitation electrode 4 is connected to the power supply side of a radiofrequency (RF) generator 1 through an RF feeder 3 and a matching circuit 2A. The matching circuit 2A matches the impedance between the RF generator 1 and the plasma excitation electrode 4, and is accommodated in a chassis 120 made of a conductive material. The RF feeder 3 and the plasma excitation electrode 4 are enclosed in a housing 21, also made of a conductive material.

RF power transmitted from the output of the RF generator 1 is sequentially fed into the plasma excitation electrode 4 through the matching circuit 2A and the RF feeder 3. A shower plate 5 having many holes 7 is in contact with projections 4a on the bottom face of the plasma excitation electrode (cathode) 4. A gas inlet pipe 17 communicates with a space 6 formed between the plasma excitation electrode 4 and the shower plate 5. An insulator 17a is provided in the middle of the gas inlet pipe 17, which is made of a conductive material, to insulate the plasma excitation electrode 4 from the gas supply source. Gas from the gas inlet pipe 17 is introduced into a chamber 60 surrounded by a chamber wall 10 through the holes 7 of the shower plate 5. The upper side of the chamber wall 10 and the plasma excitation electrode 4 are hermetically sealed with an insulator 9 interposed therebetween.

The susceptor electrode 8 is provided in the chamber 60 and serves as the common (i.e., ground) side of the discharge voltage. A workpiece W, such as a wafer, is placed thereon. A shaft 13 supports the susceptor electrode 8. The lower portion of the shaft 13 and a chamber bottom 10A are hermetically sealed with conductive bellows 11. Air is exhausted from the chamber 60 by an exhaust system (not shown).

Since the susceptor electrode 8 can move vertically together with the shaft 13 and the bellows 11, the distance between the plasma excitation electrode 4 and the susceptor electrode 8 can be adjusted while maintaining a vacuum in the chamber 60. The lower portion of the shaft 13 is grounded, and the common side of the RF generator 1 is also grounded. The chamber wall 10 has the same DC potential as that of the shaft 13.

Referring to FIG. 14, a matching circuit 2A is provided between an RF generator 1 and an RF feeder 3. The matching circuit 2A includes a plurality of passive devices to achieve impedance matching between the RF generator 1 and a plasma excitation electrode 4 to correspond to changes in a plasma state in a chamber 60. Specifically, in the example shown in FIG. 14, the matching circuit 2A includes three passive devices, that is, a load capacitor 22 consisting of a vacuum variable capacitor, an inductance coil 23, and a tuning capacitor 24 consisting of an air variable capacitor. Only one inductance coil 23 is connected between the load capacitor 22 and the tuning capacitor 24.

In general, in the plasma processing apparatus described above, when drift occurs in a high-frequency current flowing through the gap between the plasma excitation electrode 4 and the susceptor electrode 8 during discharge, the plasma density within the plasma processing chamber 60 changes, resulting in a non-uniform plasma treatment of the workpiece W. Furthermore, the plasma processing apparatus described above has an additional disadvantage of large power loss in the matching circuit due to high parasitic RF resistance in the inductance coil in the matching circuit.

Accordingly, what is needed is an improved plasma processing apparatus which avoids the non-uniform plasma treatment.

SUMMARY OF THE INVENTION

Accordingly, embodiments of the present invention provide a plasma processing apparatus capable of performing uniform plasma treatment of the treatment surface of a workpiece.

Further, by lowering the parasitic RF resistance in an inductance coil of the matching circuit, embodiments of the present invention provide a plasma processing apparatus capable of increasing the plasma-processing capacity by reducing the power loss in a matching circuit and increasing the effective power in a plasma space.

The present invention, in its first aspect, provides a plasma processing apparatus having a plasma processing chamber that accommodates an electrode pair, the electrode pair including a plasma excitation electrode for exciting plasma and a susceptor electrode facing the plasma excitation electrode. A workpiece to be plasma-treated is placed between the electrodes. The plasma processing apparatus further includes a chassis that accommodates an impedance matching circuit, provided in the middle of a supply path for feeding RF power from an RF generator to the plasma excitation electrode. The impedance matching circuit functions matches the impedance between the RF generator and the plasma processing chamber. The chassis serves as a return path from the susceptor electrode to the RF generator. In the return path provided by the chassis, impedances are axisymmetrically equal at a predetermined frequency of the RF power with respect to the direction of a current returning to the RF generator.

While not wishing to be bound by any theory, it is believed that variation in plasma density in the plasma processing chamber is caused by drift in a high-frequency current flowing through the gap between the plasma excitation electrode and the susceptor electrode and that formation of a particular return current path in the chassis, which serves as a return path of the high-frequency current to the RF generator, causes the drift of the high-frequency current. In other words, the return current path particularly in the surface of the chassis is selectively formed along the portion having the lowest impedance at a predetermined frequency of the RF power used for plasma discharge. A discharge current flowing through the gap between the electrodes of the electrode pair varies in density such that the discharge current flows through the shortest path. Thus, making the impedances on the surface of the chassis axisymmetrically equal can prevent or suppress the drift in the gap between the electrodes of the electrode pair.

In accordance with embodiments of the present invention, the chassis may accommodate not only the impedance matching circuit but also other feeders such as an RF feeder from the impedance matching circuit to the plasma excitation electrode. The term "axisymmetric" mentioned above, which will be described below in detail, means not only the generally-defined state in which two points are disposed at equal distances from the central axis thereof on a straight line perpendicular to the central axis, but also the state in which a plurality of points are disposed at equal distances from the central axis thereof on a plane perpendicular to the central axis, the plurality of points also arranged with equal intervals between each other.

The cross-section of the chassis perpendicular to the central axis thereof preferably has a shape of a regular polygon or a circle.

When the quality of the material of the chassis is uniform with respect to the high-frequency current at a predetermined frequency, if the cross-section perpendicular to the central axis has a shape of a regular polygon or a circle, the impedances on the surface of the chassis are axisymmetrically equal with respect to the high-frequency current flowing along the central axis of the chassis. Therefore, the high-frequency current uniformly flows around the peripheral wall of the chassis, so that no deviated path is formed. Regular polygons mentioned above include, for example, not only a square or a regular hexagon, but also a regular triangle or a regular pentagon in accordance with the definition of "axisymmetrial" described above. The shape of the entire chassis is not limited to a regular polygonal prism or a cylinder. In accordance with embodiments of the present invention, the entire chassis may have a shape of a regular polygonal pyramid, a cone, a frustum of a regular polygonal pyramid, a frustum of a cone, a dome, or a combination of these shapes one on top of another and sharing one central axis.

When the quality of the material forming the chassis is not uniform with respect to the high-frequency current at a predetermined frequency or when the cross-section of the chassis does not have a shape of a regular polygon or a circle, the impedances can be adjusted so as to be axisymmetrically equal, for example, by providing slits or fins for adjusting the high-frequency current path in the chassis or by bonding a conductive component having different impedance to the chassis. That is adding or subtracting impedances, adjusting the high frequency current path, or both can be performed to achieve axisymmetry.

Preferably, the RF generator and the impedance matching circuit are connected with a coaxial cable wiring line extending from the center of the top of the chassis to the RF generator. It is also preferable that the plasma processing chamber be axisymmetrically formed and that the central axis thereof be coincident with the axis of symmetry of the impedances of the chassis. It is also preferable that the susceptor electrode be axisymmetrically formed and that the central axis thereof be coincident with the axis of symmetry of the impedances of the chassis.

The return path from the susceptor electrode to the RF generator is preferably formed such that the impedances at a predetermined frequency are axisymmetrically equal with respect to not only the chassis, but also the wiring line extending from the chassis to the RF generator; and, when the peripheral wall of the plasma processing chamber functions as the return path to the RF generator, also with respect to the peripheral wall of the plasma processing chamber and the susceptor electrode itself. It is also preferable that the wiring line extending from the chassis to the RF generator be a coaxial cable, the core of which is the outer path of the RF power and the shielding line of which is the inner path thereof, and that the wiring line extend from the center of the top of the chassis, that is, from a point coincident with the axis of symmetry of the impedances, to the RF generator. It is also preferable that the plasma processing chamber and the susceptor electrode be axisymmetrically formed and that respective central axes thereof be coincident with the axis of symmetry of the impedances of the chassis.

The impedances described above preferably have a specific value at the frequency of the RF power generated at the output of the RF generator.

In general, plasma treatment is performed at frequencies within the range from 13.56 MHz to 60 MHz. By adjusting the return path, such as a chassis, so that the impedances are axisymmetrically equal at a predetermined frequency in practical use within the above-mentioned range in the plasma processing apparatus, more uniform plasma treatment of the treatment surface of a workpiece, is achieved. Thus, the plasma processing apparatus is capable of preventing drift of the discharge current that flows through a gap between electrodes of an electrode pair during actual plasma discharge.

The present invention, in its second aspect, provides a plasma processing apparatus having a plasma processing chamber including an electrode for exciting plasma; an RF generator for supplying the electrode with RF power; and a matching circuit having an input terminal and an output terminal, for matching the impedance between the plasma processing chamber and the RF generator. The RF generator is connected to an RF supplier and the RF supplier is connected to the input terminal, the electrode is connected to an RF feeder and the RF feeder is connected to the output terminal, and a ground potential portion is connected between the input terminal and the output terminal. The matching circuit includes at least two inductance coils connected in parallel.

Such a structure of the plasma processing apparatus allows the parasitic RF resistance of the inductance coils in the matching circuit to be decreased, thereby reducing the power loss in the matching circuit.

In the plasma processing apparatus according to embodiments of the present invention, the inductance coils mentioned above are preferably arranged in parallel. It is also preferable that the inductance coils be axisymmetrically arranged with respect to the center of the electrodes.

Such a structure is preferable because the equilibrium state of the high-frequency current flowing through the inductance coils in the matching circuit is maintained, thereby reducing the parasitic RF resistance and achieving a stable plasma.

In the plasma processing apparatus according to embodiments of the present invention, the electrode for exciting plasma may also serve as an electrode of a tuning capacitor in the matching circuit. Thus, the apparatus is simplified and the parasitic RF resistance reduced.

Since the inductance coils of the matching circuit have a low parasitic RF resistance, low power loss is experienced in the matching circuit and increased effective power in the plasma space can be achieved.

The plasma processing apparatus according to the present invention is useful for efficiently performing plasma treatment such as CVD, sputtering, dry etching, or ashing.

The above and other objects, features, and advantages of the present invention will become clear from the following description of the preferred embodiments taken in conjunction with the accompanying drawings.

DESCRIPTION OF THE PREFERRED EMBODIMENTS

Figure 1:
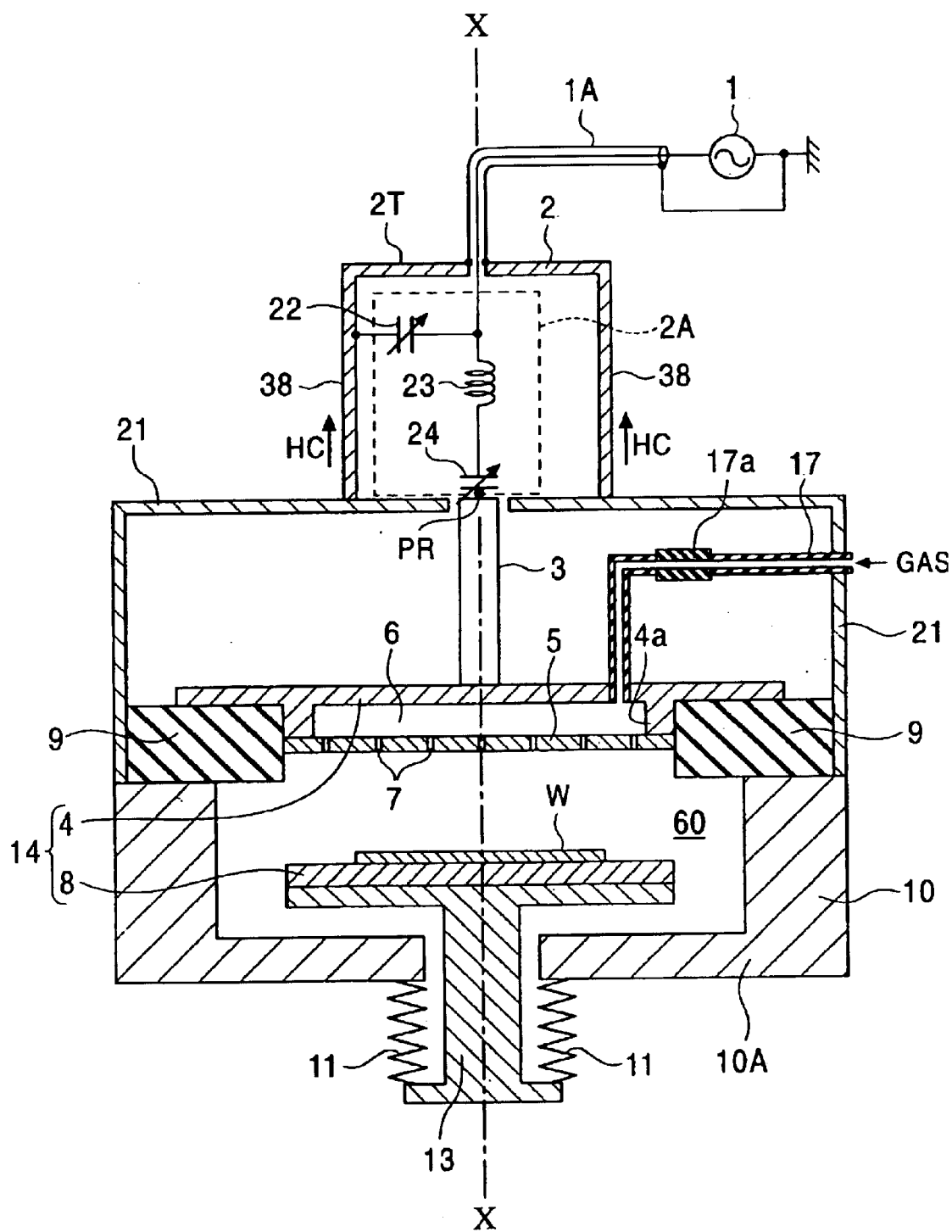
FIG. 1 is a sectional view showing the structure of a plasma processing apparatus according to a first embodiment of the present invention.

Although embodiments of the present invention will be described using specific examples, the present invention is not limited to such examples. The accompanying drawings are for illustrating the spirit of the present invention, and unnecessary elements are omitted for illustrative purposes. Elements shown in the drawings are not necessarily identical to actual elements in shape, size ratio, number, etc.

First Embodiment

FIG. 1 is a sectional view showing the structure of a plasma processing apparatus according to a first embodiment of the present invention. The plasma processing apparatus is of a single-frequency-excitation type, which can perform plasma treatment such as CVD, sputtering, dry etching, or ashing. The apparatus has a parallel plate electrode pair 14 of a plasma excitation electrode 4 for exciting plasma and a susceptor electrode 8. A workpiece W to be plasma-treated is placed on the susceptor electrode 8 facing the plasma excitation electrode 4. The plasma excitation electrode 4 is connected to the power supply side of an RF generator 1 through an RF feeder 3, a matching circuit 2A, and a core of a coaxial cable 1A. The RF generator 1 provides RF power at its output terminal with a frequency of 40.68 MHz.

The matching circuit 2A matches the impedance between the RF generator 1 and the plasma excitation electrode 4, and is accommodated in a chassis 2 formed of aluminum alloy plates. The top plate 2T of the chassis 2 is a square, as described in detail below, and the central axis of the top plate 2T is coincident with an axial line X—X of the plasma processing apparatus in FIG. 1.

The coaxial cable 1A extends from the center of the top plate 2T of the chassis 2 toward the RF generator 1. The RF feeder 3 and the plasma excitation electrode 4 are enclosed in a housing 21 formed of aluminum alloy plates as in the chassis 2. The housing 21 is cylindrically shaped and arranged such that the central axis thereof is coincident with the axial line X—X. The housing 21 is coupled to the chassis 2.

The housing 21 shares the axial line X—X with the chassis 2. Since the chassis 2 and the housing 21 are axially symmetric and are coupled to each other, these can be considered to be an integrated chassis.

The plasma processing apparatus includes a plasma excitation electrode 4 and a shower plate 5 provided in the upper portion of a plasma processing chamber 60. The susceptor electrode 8 that carries the workpiece W is in the lower portion of the chamber 60 and faces the shower plate 5. The susceptor electrode 8 is disc-shaped, and is arranged such that the central axis thereof is coincident with the axial line X—X. A chamber wall 10 surrounding the chamber 60 is also cylindrically shaped and is arranged such that the central axis thereof is coincident with the axial line X—X. The chamber wall 10 is coupled to the housing 21.

As described above, in the plasma processing apparatus according to the first embodiment shown in FIG. 1, the chassis 2, the housing 21, the chamber wall 10, and the susceptor electrode 8 are formed and arranged such that each of them is axisymmetric about the common axial line X—X. The coaxial cable 1A having an axisymmetric cross-section itself serves as a wiring line connecting the RF generator 1 and the matching circuit 2A and extends from the center of the top plate 2T of the chassis 2.

The plasma excitation electrode 4 is connected to the power supply side of the RF generator 1 through the RF feeder 3, the matching circuit 2A, and the core of the coaxial cable 1A, as described above. A shaft 13 is connected to the center of the lower portion of the susceptor electrode 8. The shaft 13 extends downward through a chamber bottom 10A. The lower portion of the shaft 13 is hermetically sealed with the central portion of the chamber bottom 10A with conductive bellows 11. The susceptor electrode 8 and the shaft 13 can move vertically with the bellows 11 to adjust the distance between the plasma excitation electrode 4 and the susceptor electrode 8. The susceptor electrode 8 and the shaft 13 are electrically connected to the chamber bottom 10A. Therefore, the susceptor electrode 8, the shaft 13, the bellows 11, the chamber bottom 10A, the chamber wall 10, the housing 21, and the chassis 2 are electrically connected and have the same DC potential. The chassis 2 is connected to the shielding line (outer conductor) of the coaxial cable 1A. Since the shielding line is connected to the grounded common side of the RF generator 1, a return path from the susceptor electrode 8 to the RF generator 1 is DC-grounded.

The RF feeder 3 is composed of a silver-coated copper plate, which is, for example, 50 to 100 mm wide, 0.5 mm thick, and 100 to 300 mm long. The RF feeder 3 is detachably mounted to both the output terminal of a tuning capacitor 24, described below, in the matching circuit 2A and the plasma excitation electrode 4 with coupling means such as screws.

An annular projection 4a is provided on the bottom face of the plasma excitation electrode 4. A shower plate 5 having many holes 7 is in contact with the annular projection 4a below the plasma excitation electrode 4. The plasma excitation electrode 4 and the shower plate 5 define a space 6. A gas inlet pipe 17, which extends through a sidewall of the housing 21 and the plasma excitation electrode 4, communicates with the space 6. The gas inlet pipe 17 is formed of a conductive material and is provided with an insulator 17a in the middle thereof, inside the housing 21, for insulating the plasma excitation electrode 4 from the gas supply source. Gas from the gas inlet pipe 17 is introduced into the chamber 60 through the holes 7 of the shower plate 5. The chamber wall 10 and the plasma excitation electrode 4 are insulated from each other with an annular insulator 9. An exhaust system (not shown) is connected to the chamber 60.

The matching circuit 2A adjusts the impedance in accordance with, for example, changes in plasma state in the chamber 60. The matching circuit 2A is provided between the RF generator 1 and the RF feeder 3, as shown in FIG. 1. The matching circuit 2A has an inductance coil 23, a tuning capacitor 24 consisting of an air variable capacitor, and a load capacitor 22 consisting of a vacuum variable capacitor. The inductance coil 23 and the tuning capacitor 24 are connected in series in the named order from the input terminal to the output terminal of the matching circuit 2A, and the load capacitor 22 is provided between the input terminal of the inductance coil 23 and the chassis 2 (common potential portion). The inductance coil 23 and the tuning capacitor 24 are directly connected without an interposing conductor. The tuning capacitor 24 serves as the output terminal of the matching circuit 2A. The output terminal PR of the tuning capacitor 24 is connected to the plasma excitation electrode 4 through the RF feeder 3.

Figure 2A:
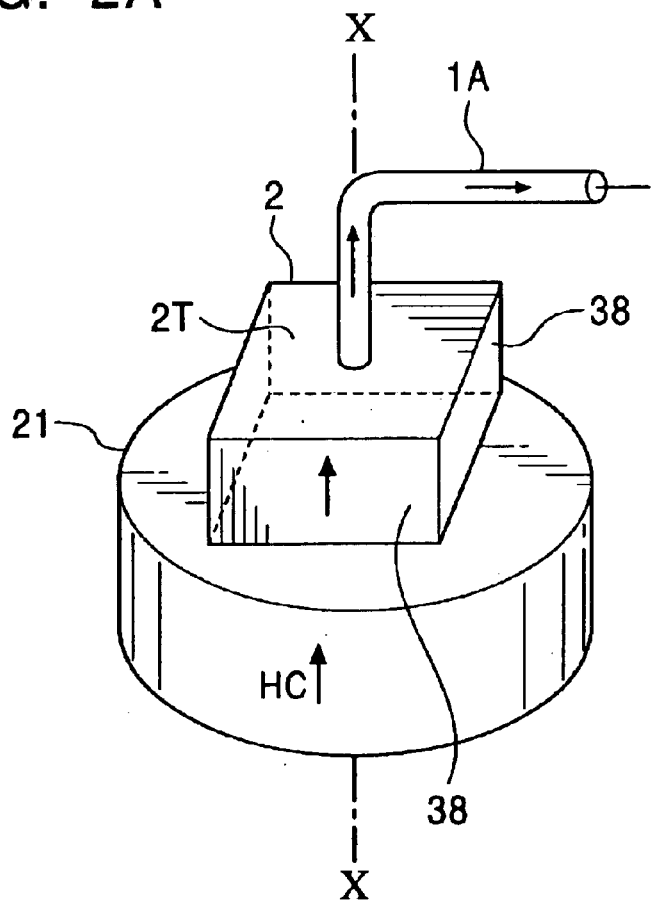
FIG. 2A is a perspective view showing the chassis according to the first embodiment in FIG. 1.
Figure 2B:
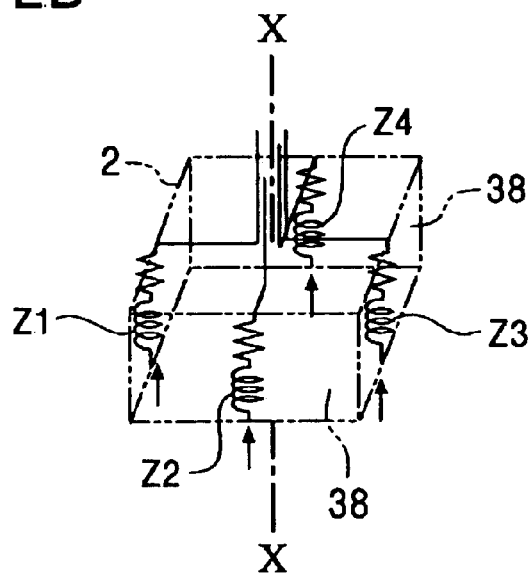
FIG. 2B is a diagram showing the distribution of impedances in this chassis.

FIG. 2A is a perspective view showing the chassis according to the first embodiment. FIG. 2B is a schematic diagram showing the impedance distribution in this chassis.

Referring to FIG. 2A, the chassis 2 is formed of aluminum alloy plates. The top plate 2T of the chassis 2 is a square. The axis extending through the center of the top plate 2T is coincident with the axial line X—X in the plasma processing apparatus shown in FIG. 1. The coaxial cable 1A extends from the center of the top plate 2T of the chassis 2 to the RF generator 1. The bottom face of the chassis 2 is coupled to the cylindrical housing 21. The central axis of the housing 21 is also coincident with the axial line X—X.

All four sidewalls 38 of the chassis 2 serve as return paths of a high-frequency current HC flowing from the housing 21 to the RF generator 1 through the coaxial cable 1A. These sidewalls 38, which are paths of the high-frequency current HC, have impedances Z1, Z2, Z3, and Z4 depending on the frequency of the high-frequency current HC, as shown in FIG. 2B. In the plasma processing apparatus according to the first embodiment, at a frequency of 40.68 MHz generated at the output of the RF generator 1, the values of the impedances Z1, Z2, Z3, and Z4 are adjusted so as to be equal to each other. In other words, in the return paths in the chassis 2, the impedances Z1, Z2, Z3, and Z4 at a predetermined frequency (for example, 40.68 MHz) of the RF power are axisymmetrically equal about the axis of symmetry, that is, the axial line X—X, with respect to the direction of the current returning to the RF generator 1. Similarly, according to this embodiment, also in the return paths in the housing 21, impedances at a predetermined frequency (e.g., 40.68 MHz) are axisymmetrically equal about the axis of symmetry, that is, the axial line X—X.

Referring to FIG. 1, the output terminal (high-voltage side) of the RF generator 1 is connected to the matching circuit 2A through the core of the coaxial cable 1A. One end of the shielding line of the coaxial cable 1A is connected to the center of the top plate 2T of the chassis 2 and the other end of the shielding line thereof is connected to the common side of the RF generator 1. Since the common side of the RF generator 1 is grounded, all of the return paths including the susceptor electrode 8, the shaft 13, the bellows 11, the chamber wall 10, the housing 21, and the chassis 2 are DC-grounded. One end of the load capacitor 22 is also DC-grounded.

An embodiment in which the workpiece W is plasma-treated using the plasma processing apparatus according the first embodiment will now be described. Referring to FIG. 1, the workpiece W is placed onto the susceptor electrode 8. Next, the chamber 60 is evacuated to a predetermined degree of vacuum. Plasma-generating gas is introduced into the chamber 60 through the gas inlet pipe 17 and the RF power is fed from the RF generator 1. The operational conditions, such as the degree of vacuum, the type of plasma-generating gas, the pressure in the processing chamber, the frequency of the RF power, and the electrical power, vary in accordance with the purpose of the plasma treatment of the workpiece W, the efficiency of the apparatus, and so on. Since these conditions are the same as the operational conditions in the known plasma processing apparatuses, a detailed description thereof is omitted here. The RF power (the high-voltage side) from the RF generator 1 is fed into the matching circuit 2A through the core of the coaxial cable 1A and is then transmitted from the output terminal PR. The RF power is then fed to the plasma excitation electrode 4 through the RF feeder 3. Since the plasma excitation electrode 4 faces the susceptor electrode 8, the susceptor being connected to the common side, vacuum discharge occurs in the chamber 60. The gas introduced from the gas inlet pipe 17 into the chamber 60 is excited by this vacuum discharge, thereby producing the plasma. The gas radially impinges against the workpiece W through the many holes 7 formed on the shower plate 5 in order to perform the plasma treatment of the surface of the workpiece W.

At this time, a potential difference corresponding to the discharge voltage is generated between the plasma excitation electrode 4 and the susceptor electrode 8. Each of the shaft 13, the bellows 11, the chamber bottom 10A, the chamber wall 10, the housing 21, the chassis 2, and the shielding line of the coaxial cable 1A, serving as the return path from the susceptor electrode 8 to the common side of the RF generator 1, has AC resistance, that is, impedance. Therefore, while the susceptor electrode 8 is DC-grounded, it has a potential corresponding to the current flowing through the above impedance for AC voltage. Accordingly, a high-frequency current flows from the susceptor electrode 8 to the common side of the RF generator 1. This high-frequency current flows over the surface of conductive components such as the chamber wall 10, the housing 21, and the chassis 2.

Figure 3:
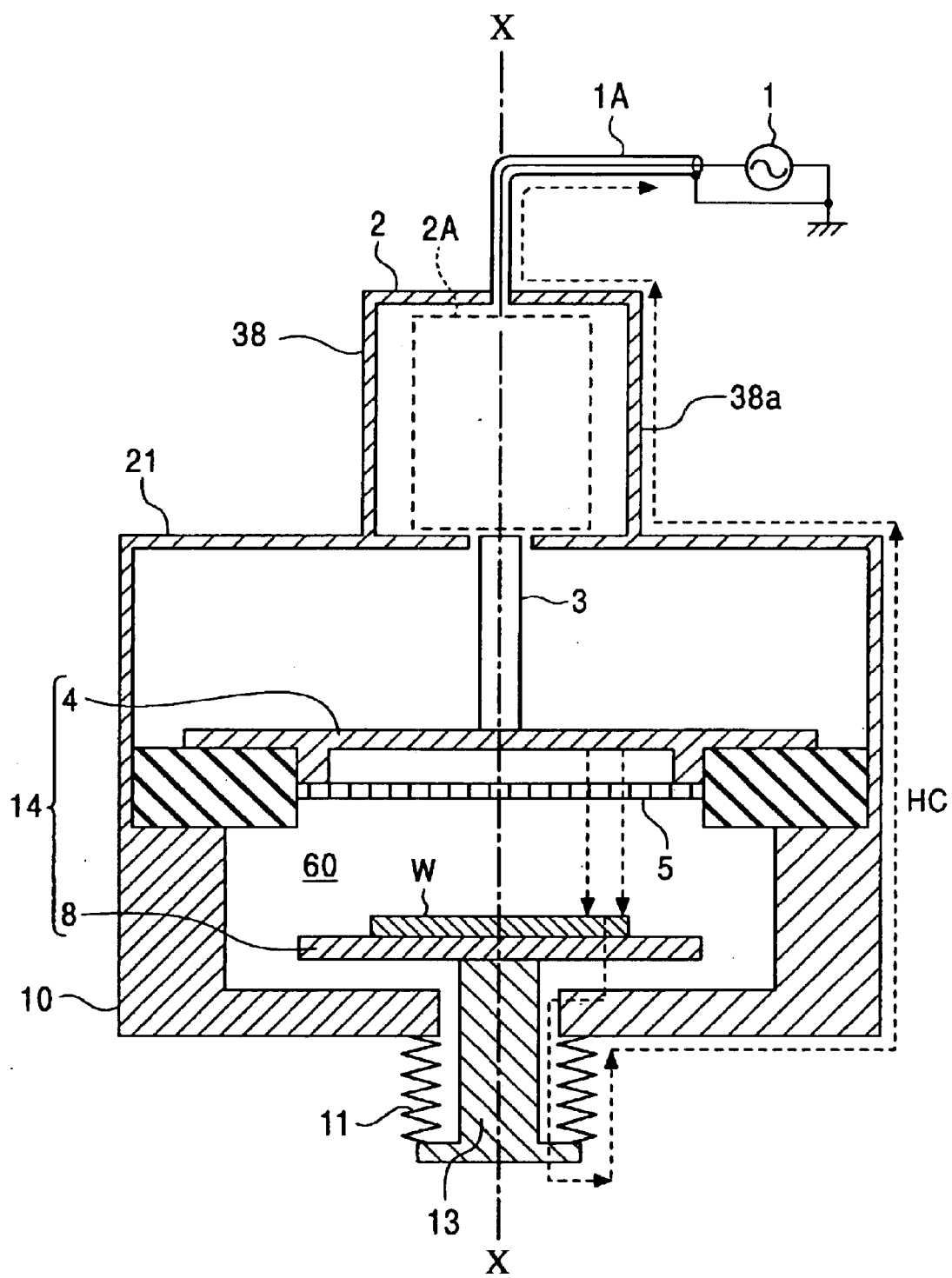
FIG. 3 is a conceptual diagram illustrating a path of high-frequency current in the plasma processing apparatus.

Referring to FIGS. 2A and 2B, the four sidewalls 38 of the chassis 2 are adjusted such that the impedances Z1, Z2, Z3, and Z4 are equal along the direction of the high-frequency current HC. As a result, the high-frequency current flowing over the surface of the chassis 2 becomes uniform and no particular drift path is formed. In contrast, referring to FIG. 3, when the impedances of the four sidewalls of the chassis 2 at a predetermined frequency are not uniform, a high-frequency current path is selectively formed along the portion having the lowest impedance (for example, a sidewall 38a). When drift occurs in the high-frequency current flowing over the surface of the chassis 2, a discharge current flowing through the gap between the electrodes of the electrode pair 14 varies in density such that the discharge current flows through the shortest path, as shown by a dotted line arrow HC in FIG. 3, resulting in non-uniform plasma treatment of the workpiece W. In other words, when the impedances of the return paths in the chassis 2 at a predetermined frequency are axisymmetrically equal about the axis of symmetry, that is, the axial line X—X, it is possible to perform uniform plasma treatment of the workpiece W. Conversely, when the impedance of the return path in the chassis 21 at a predetermined frequency are not equal, non uniformities in plasma treatment may result.

Since the chassis 2 and the housing 21 are axisymmetric about the axial line X—X and are electrically connected, all the cross-sections perpendicular to the axial line X—X become axisymmetric, even when the top plate 2T of the chassis 2 is a square and the housing 21 is a cylinder, so that the chassis 2 and the housing 21 can be considered to be an integrated chassis. Furthermore, as long as the quality of the materials thereof is uniform, in a structure (chassis in a broad sense) in which the chassis 2 and the housing 21 are integrated, the impedances are axisymmetrically equal about the axis of symmetry, that is, the axial line X—X, with respect to the direction of the current returning to the RF generator 1.

According to the first embodiment, since the susceptor electrode 8 and the chamber wall 10 are also axisymmetrically equal about the axial line X—X and the coaxial cable 1A extends from the center of the top plate 2T of the chassis 2, as described above, factors causing drift in the return path of the high-frequency current are almost eliminated, thereby achieving uniform plasma treatment of the workpiece W.

Second Embodiment

A second embodiment of the present invention includes various modifications to the shape of the chassis. Since the features other than the shape of the chassis and the arrangements thereof are the same as in the first embodiment, detailed descriptions thereof are omitted here.

Figure 4:
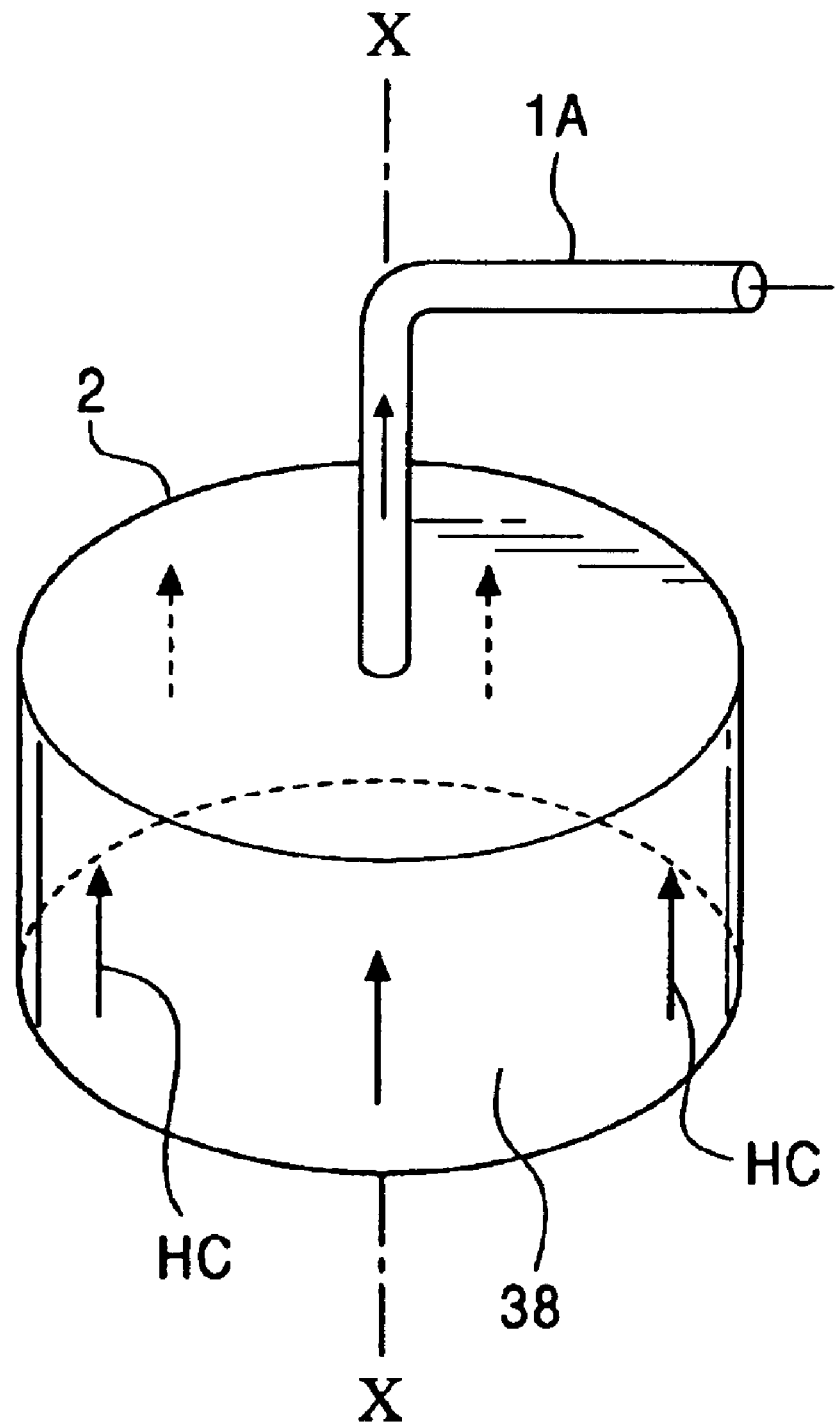
FIG. 4 is a perspective view of a chassis used in a plasma processing apparatus according to a second embodiment of the present invention.

FIG. 4 shows a modification in which a chassis 2 is cylindrically formed about the rotation axis, that is, the axial line X—X. In the chassis 2, impedances at a predetermined frequency are axisymmetrically equal about the axis of symmetry, that is, the axial line X—X, with respect to a high-frequency current HC returning to a generator through a sidewall 38.

Figure 5:
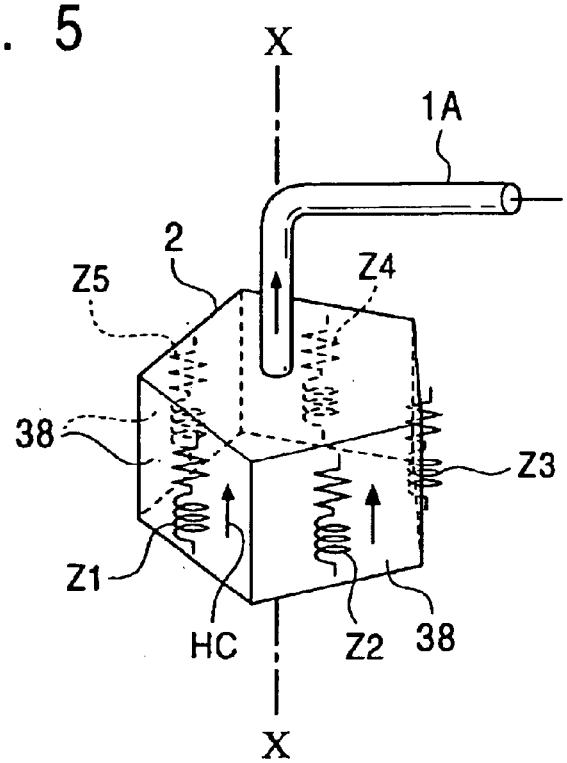
FIG. 5 is a perspective view of another chassis used in the plasma processing apparatus according to the second embodiment.

FIG. 5 shows a modification in which a chassis 2 is formed in the shape of a regular pentagonal prism about the central axis, that is, the axial line X—X. In all five sidewalls 38 of the chassis 2, impedances Z1, Z2, Z3, Z4, and Z5 at a predetermined frequency are equal with respect to a high-frequency current HC returning to a RF generator. According to this modification, since the five sidewalls 38 are disposed at equal distances from the axial line X—X, this case corresponds to that in which "a plurality of points are disposed at equal distances from the central axis thereof on a plane perpendicular to the central axis and they are also arranged with equal intervals between each other" among the definitions of "axisymmetric" described above. In this case, the impedances are axisymmetrically equal about the axis of symmetry, that is, the axial line X—X.

Figure 6:
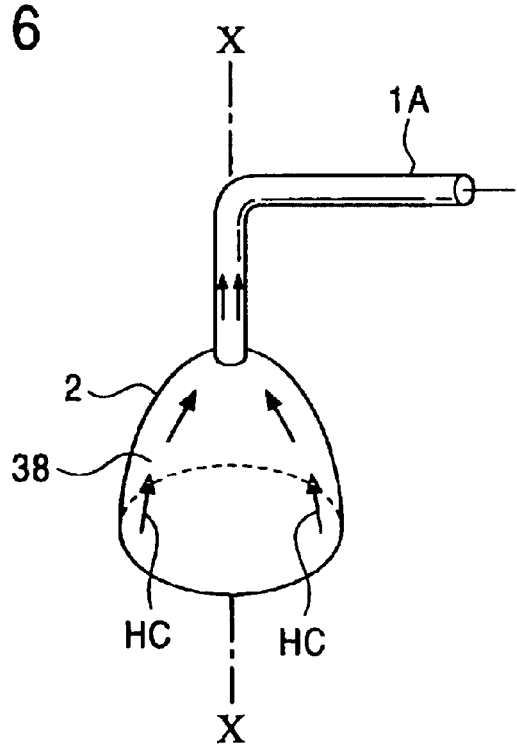
FIG. 6 is a perspective view of another chassis used in the plasma processing apparatus according to the second embodiment.

FIG. 6 shows a modification in which a chassis 2 is formed in the shape of a dome about the rotation axis, that is, the axial line X—X. Since the chassis 2 is a body of rotation about the central axis, that is, the axial line X—X, and a coaxial cable 1A extends from the top thereof, impedances at a predetermined frequency are axisymmetrically equal about the axis of symmetry, that is, the axial line X—X, with respect to a high-frequency current HC flowing through an arbitrary point on a sidewall 38.

Figure 7:
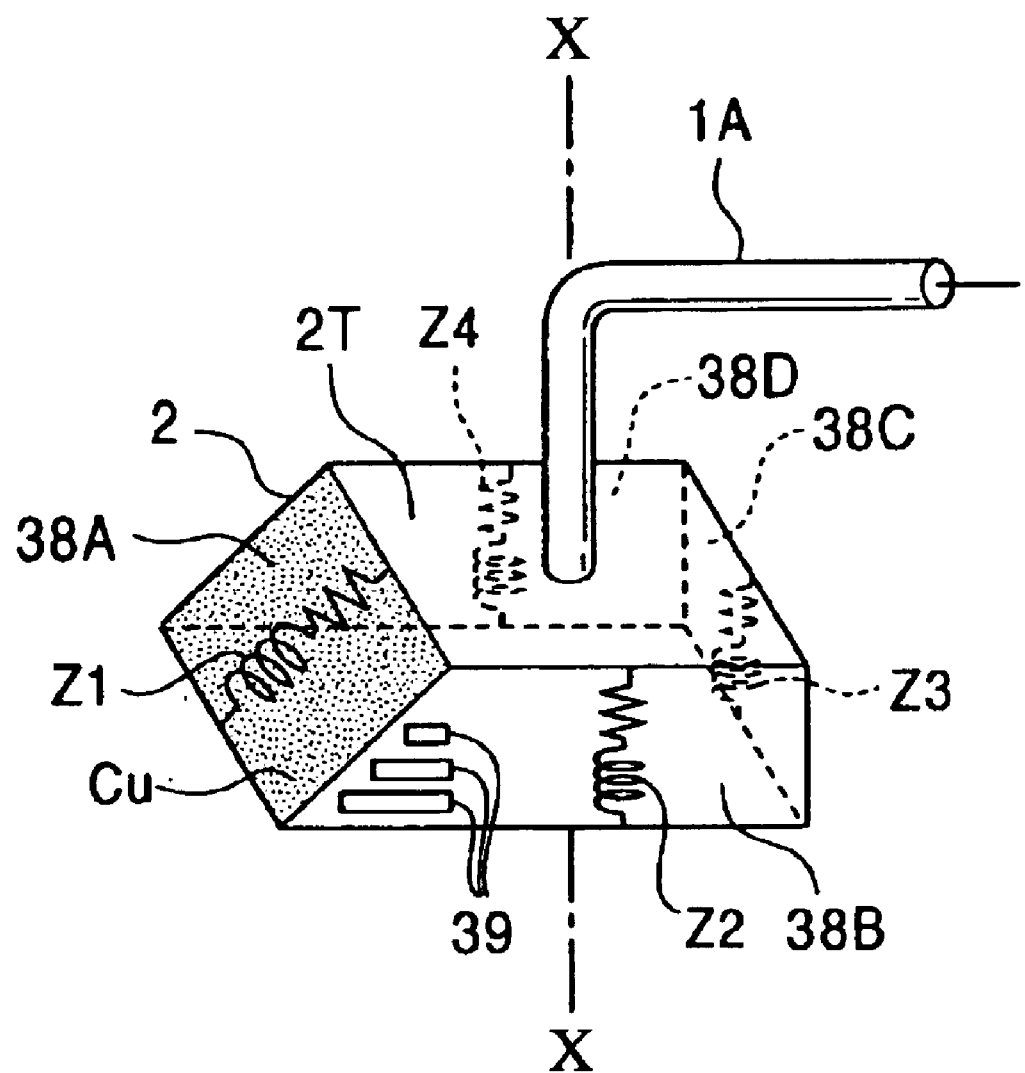
FIG. 7 is a perspective view of another chassis used in the plasma processing apparatus according to the second embodiment.

FIG. 7 shows a modification in which a chassis 2 is formed in the shape of a box with one slanted sidewall. The chassis 2 is formed of stainless steel plates. In this chassis 2, the top plate 2T is a square, the central axis of which is coincident with the axial line X—X, and a coaxial cable 1A extends from the center of the top plate 2T. One sidewall 38A among the four sidewalls is provided at a slant, and the other three sidewalls are provided perpendicular to the bottom face of the chassis 2. Therefore, the slanted sidewall 38A, sidewalls 38B and 38D on the left and right sides of the side wall 38A, and a side wall 38C facing the sidewall 38A differ in area, resulting in different impedances with respect to a high-frequency current flowing through each of the sidewalls. Consequently, adjusting means for eliminating the differences in the impedances and for making the impedance of each of the sidewalls axisymmetric about the axial line X—X is provided.

A copper plate Cu is bonded to the surface of the sidewall 38A. Since the copper plate Cu has an impedance smaller than the stainless steel plate, the impedance Z1 of the sidewall 38A can be substantially reduced. Slits 39 are formed on the sidewalls 38B and 38D in a direction blocking the path of the high-frequency current. The formation of the slits allows the impedances Z2 and Z4 of the sidewalls 38B and 38D to substantially increase. As described above, according to the modification shown in FIG. 7, the impedances Z1, Z2, Z3, and Z4 of the four sidewalls 38A, 38B, 38C, and 38D are made axisymmetrically equal with impedance adjusting means, and thus can accommodate non-axisymmetric shapes of the chassis. That is, the impedance adjusting means such as including those described can accommodate differences in the shapes of the chassis and the effects those shapes would have on the return path impedances. For example, instead of the slits 39, a fin that also has an air-cooling function may serve as means for increasing the impedance to produce similar effects.

Although, in the plasma processing apparatuses of the present invention described above, base materials such as the chassis 2, the housing 21, and the chamber wall 10 are ordinarily aluminum or stainless steel, a low-resistance conductive path having a lower resistance with respect to the high-frequency current may be provided on the surfaces thereof. The provision of the low-resistance conductive path can further reduce the loss of RF power supplied to the plasma generation space. This low-resistance conductive path is preferably made of gold, silver, copper, or an alloy containing at least such materials. The low-resistance conductive path may be formed such that it covers the surface of each of the above components. One or more linear or zonal low-resistance conductive paths, which run from the susceptor electrode 8 to the RF generator 1 through the surfaces of such components, may be provided.

In the plasma processing apparatus according to the present invention, the surfaces of the chassis 2, the housing 21, the chamber wall 10, the chamber bottom 10A, the bellows 11, and so on may be covered with an insulating film if required. An insulating film made of polyimide, PFA (tetrafluoroethylene-perfluoroalkylvinylether copolymer), PTFE (polytetrafluoroethylene), ETFE (tetrafluoroethylene-ethylene copolymer), or the like is used. The polyimide, the PFA (tetrafluoroethylene-perfluoroalkylvinylether copolymer), and the PTFE (polytetrafluoroethylene) have superior heat resistance, whereas the ETFE (tetrafluoroethylene-ethylene copolymer) has superior abrasion resistance. Accordingly, it is preferable to selectively use a material appropriate to the application or to form a multi-layer film.

In the plasma processing apparatus according to the present invention, RF power preferably with a frequency of 13.56 MHz or more, specifically with a frequency of, for example, 13.56 MHz, 27.12 MHz, or 40.68 MHz, can be fed to the apparatus to produce a plasma between the electrodes of the electrode pair 14. With this plasma, plasma treatment such as CVD, dry etching, or ashing can be performed on the workpiece W held on the susceptor electrode 8.

When plasma treatment such as reactive ion etching (RIE) is performed, the workpiece W may be mounted to the plasma excitation electrode 4, instead of being placed on the susceptor electrode 8. An inductively coupled plasma (ICP) excitation electrode pair or a radial line slot antenna (RLSA) electrode pair may be used instead of the parallel plate electrode pair. Accordingly, the scope of the present invention is not to be limited by the illustrative examples provided but is intended to extend to all forms of plasma treatments.

In the plasma processing apparatus constructed as described above, an operator sets various processing conditions such as deposition conditions, annealing conditions, and heat treatment conditions, and a processing sequence which are appropriate for the workpiece W. However, the operation of individual components is controlled by a controller unit (not shown) and the apparatus is automatically operated. Therefore, in the plasma processing apparatus, when the operator operates a start switch after the workpiece W to be treated is set in a loading cassette (not shown), a carrier robot carries the workpiece W form the loading cassette into the chamber 60. After a series of processes are automatically and sequentially performed in the chamber 60, the carrier robot sets the treated workpiece W in an unloading cassette.

Third Embodiment

Figure 8:
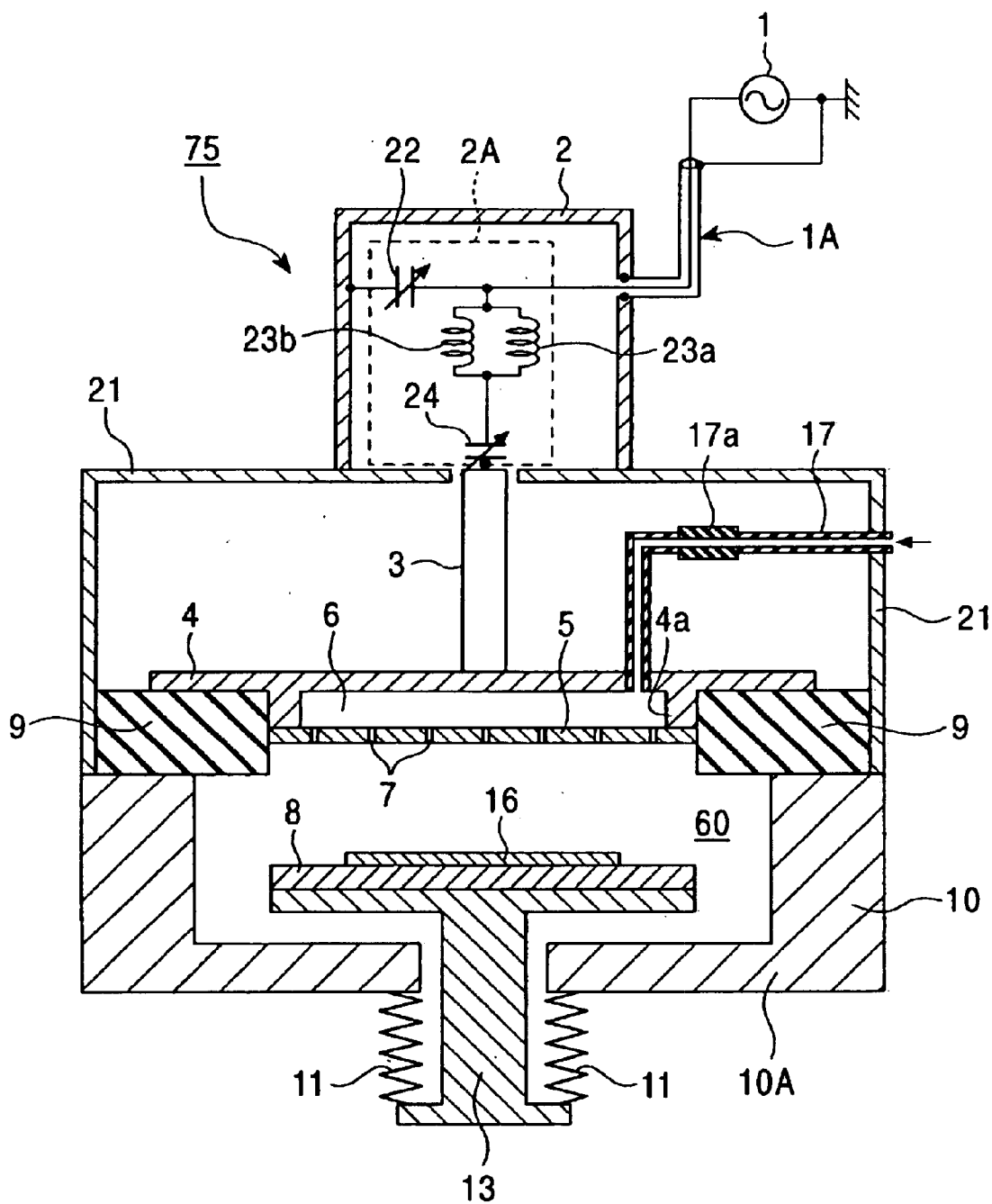
FIG. 8 is a sectional view schematically showing the structure of a plasma processing apparatus according to a third embodiment of the present invention.

FIG. 8 is a sectional view schematically showing the structure of a plasma processing apparatus according to a third embodiment of the present invention.

Figure 13:
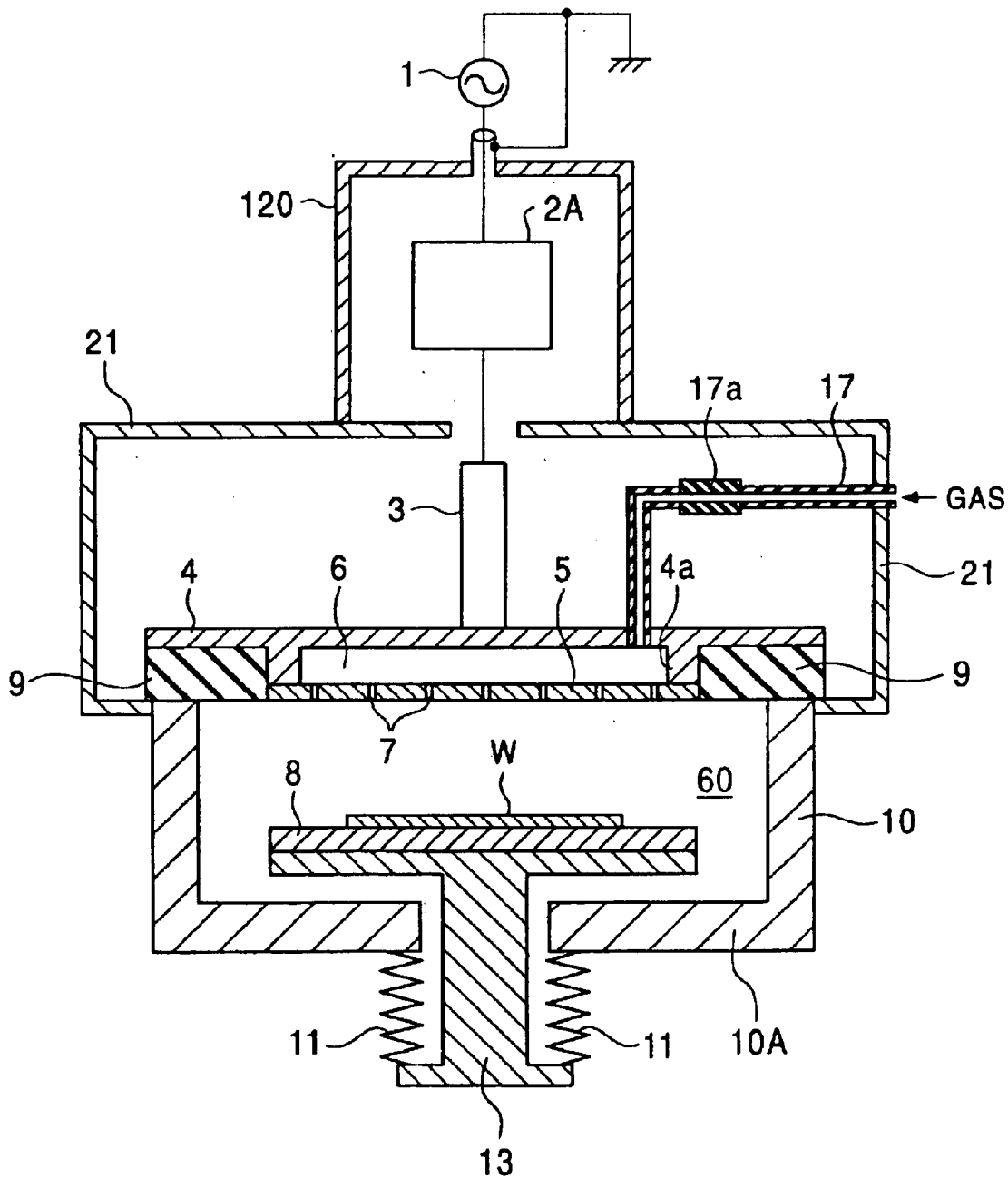
FIG. 13 is a sectional view showing a conventional plasma processing apparatus.
Figure 14:
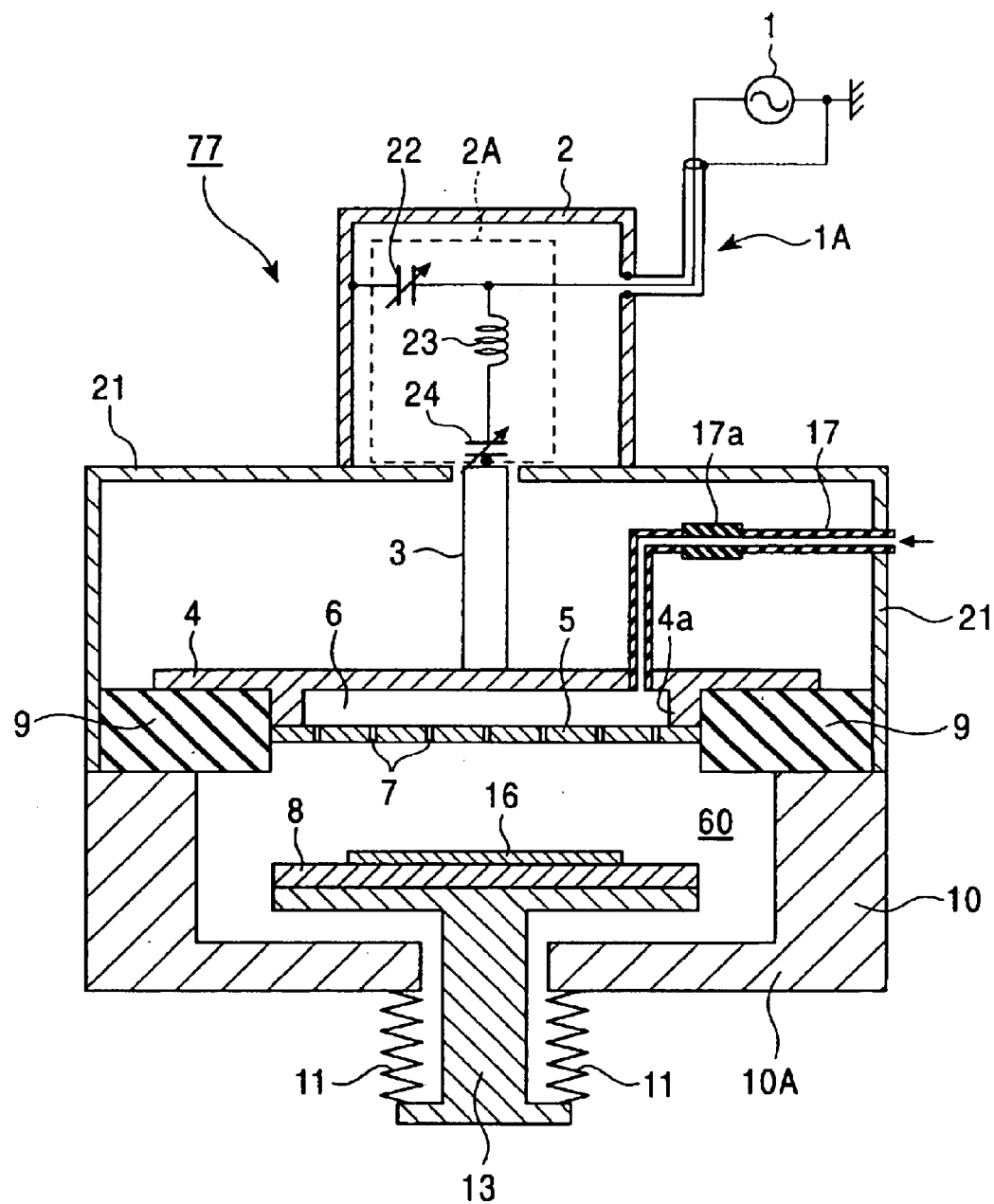
FIG. 14 is a sectional view schematically showing the configuration of a conventional plasma processing apparatus.

Since the main structure of the plasma processing apparatus according to the third embodiment is similar to that of the conventional plasma processing apparatuses shown in FIGS. 13 and 14, corresponding components having corresponding functions have been given the same numerical designations. The plasma processing apparatus according to the third embodiment differs from the known plasma processing apparatus in FIG. 14 only in the arrangement of a matching circuit 2A in a chassis 2. Accordingly, the arrangement in the matching circuit 2A will now be described in detail.

In the plasma processing apparatus according to the third embodiment shown in FIG. 8, two inductance coils 23a and 23b are connected in parallel in a plasma chamber 75.

The two inductance coils 23a and 23b are provided in parallel and are axisymmetrically arranged with respect to the center of a plasma excitation electrode 4, that is, they are axisymmetrically arranged with respect to the center of an RF feeder 3.

Figure 9:
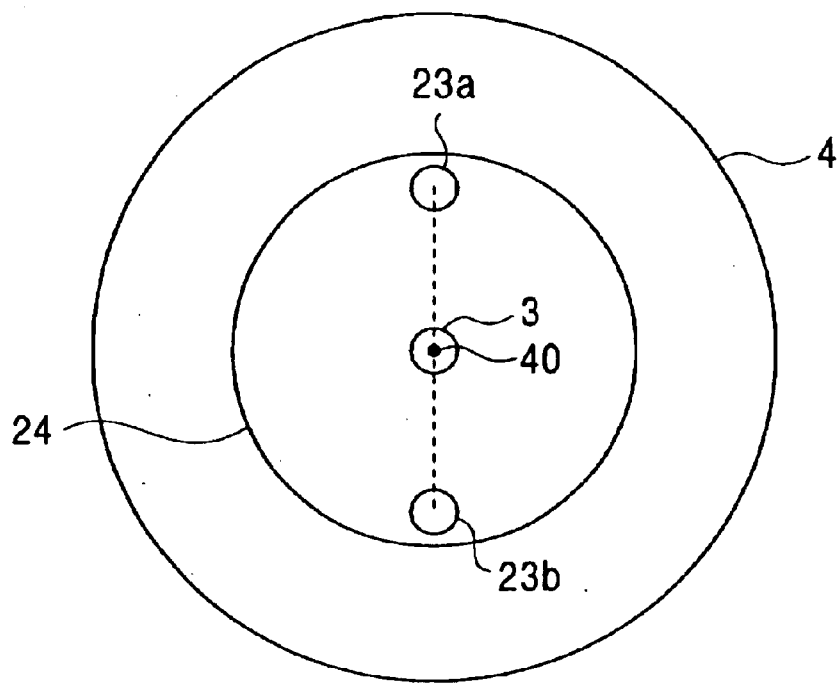
FIG. 9 is a plan view showing the arrangement of inductance coils in the plasma processing apparatus in FIG. 8.

FIG. 9 is a plan view showing the arrangement of the inductance coils according to the third embodiment of the present invention. Referring to FIG. 9, the matching circuit 2A in the plan view has the plasma excitation electrode 4, which is circular, at the outermost part, an electrode plate of a circular tuning capacitor 24 on the inside thereof, and the RF feeder 3 at the innermost part. The center 40 of the plasma excitation electrode 4 is coincident with the centers of the tuning capacitor 24 and the RF feeder 3.

The two inductance coils 23a and 23b are axisymmetrically arranged with respect to the center 40 of the plasma excitation electrode 4. They are spatially provided in parallel and electrically connected in parallel.

Although two inductance coils are shown in the third embodiment, the number thereof is not limited to two; more than two inductance coils may be used and still be in keeping with the spirit and scope of the present invention.

Provision of a plurality of inductance coils, axisymmetrically and in parallel with respect to the center 40 of the plasma excitation electrode 4, allows the parasitic RF resistance to be reduced, thereby achieving low power loss in the matching circuit 2A.

Fourth Embodiment

Figure 10:
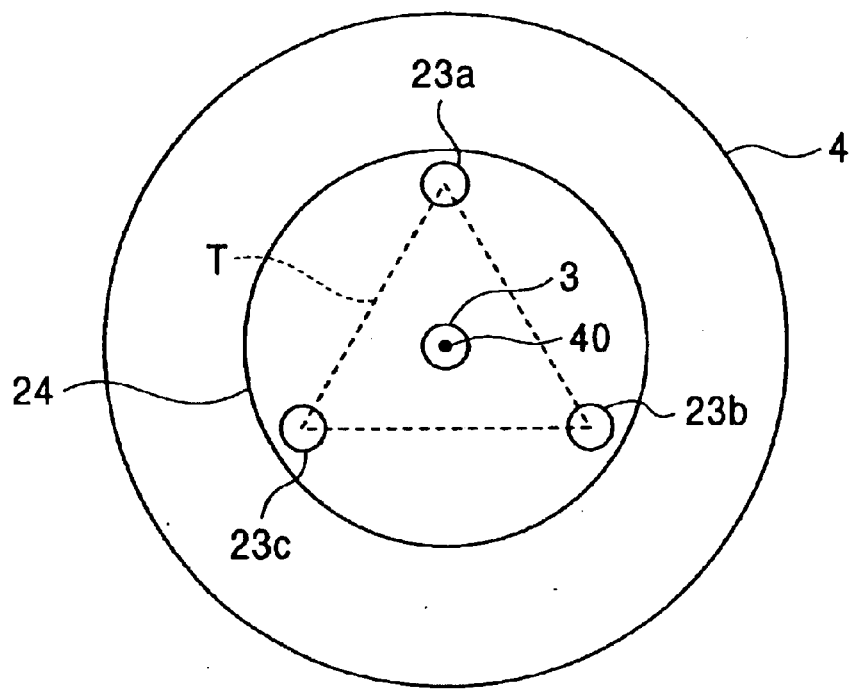
FIG. 10 is a plan view showing the arrangement of inductance coils in a plasma processing apparatus according to a fourth embodiment of the present invention.

FIG. 10 is a plan view showing the arrangement of inductance coils according to a fourth embodiment of the present invention. A plasma excitation electrode 4, a tuning capacitor 24, and an RF feeder 3 in FIG. 10 are arranged in the same way as in the third embodiment shown in FIG. 9.

In the plan view according to the fourth embodiment in FIG. 10, three inductance coils 23a, 23b, and 23c are arranged such that they form a regular triangle (T) in plan view. The center of the regular triangle (T) of these inductance coils is coincident with the center 40 of the plasma excitation electrode 4, that is, the centers of the tuning capacitor 24 and the RF feeder 3 in this plan view. The three inductance coils 23a, 23b, and 23c are spatially arranged in parallel and are electrically connected in parallel as in FIG. 8.

Such an arrangement of the inductance coils contributes to a further reduction in the parasitic RF resistance, thereby achieving low power loss in the matching circuit 2A.

Fifth Embodiment

Figure 11:
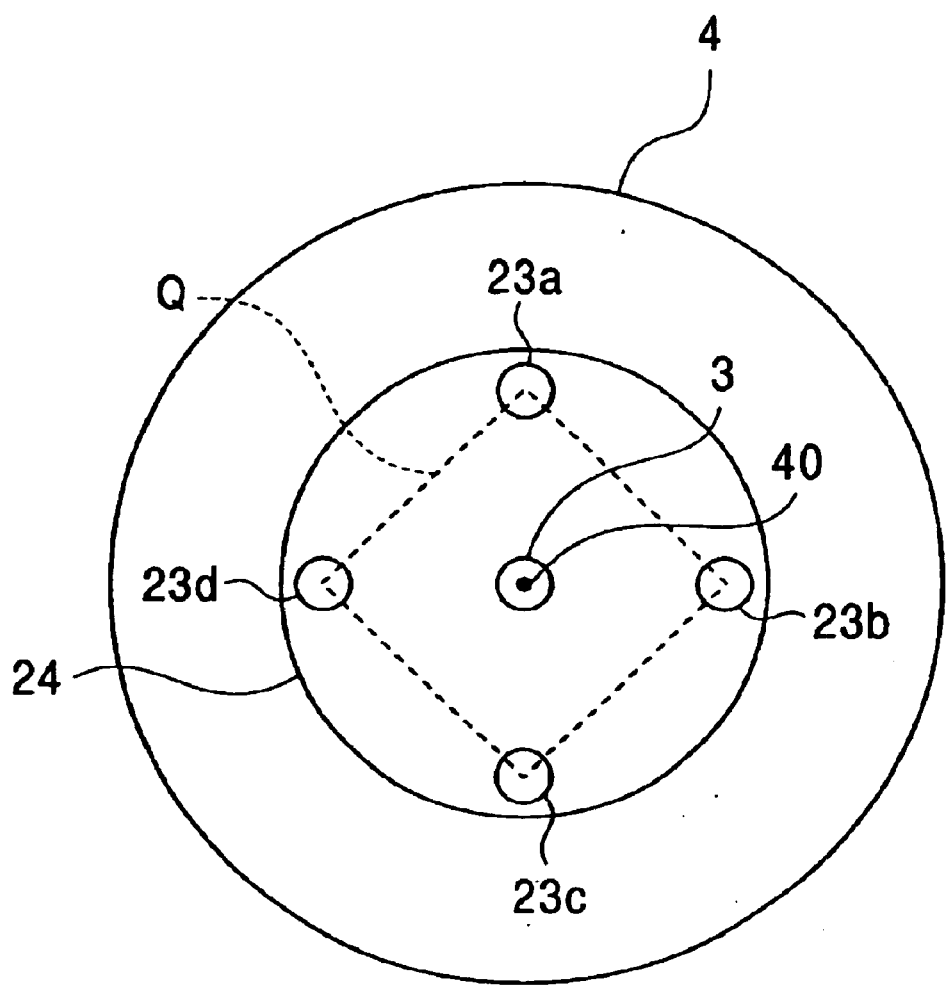
FIG. 11 is a plan view showing the arrangement of inductance coils in a plasma processing apparatus according to a fifth embodiment of the present invention.

FIG. 11 is a plan view showing the arrangement of inductance coils according to a fifth embodiment of the present invention. A plasma excitation electrode 4, a tuning capacitor 24, and an RF feeder 3 in FIG. 11 are arranged in the same way as in the third embodiment shown in FIG. 9.

In the plan view according to the fifth embodiment in FIG. 11, four inductance coils 23a, 23b, 23c, and 23d are arranged such that they form a square (Q) in plan view. The center of the square (Q) of these inductance coils is coincident with the center 40 of the plasma excitation electrode 4, that is, the centers of the tuning capacitor 24 and the RF feeder 3 in this plan view. The four inductance coils 23a, 23b, 23c, and 23d are spatially arranged in parallel and are electrically connected in parallel, as in FIG. 8.

Such an arrangement of the inductance coils contributes to a further reduction in the parasitic RF resistance, thereby achieving low power loss in the matching circuit 2A.

Sixth Embodiment

Figure 12:
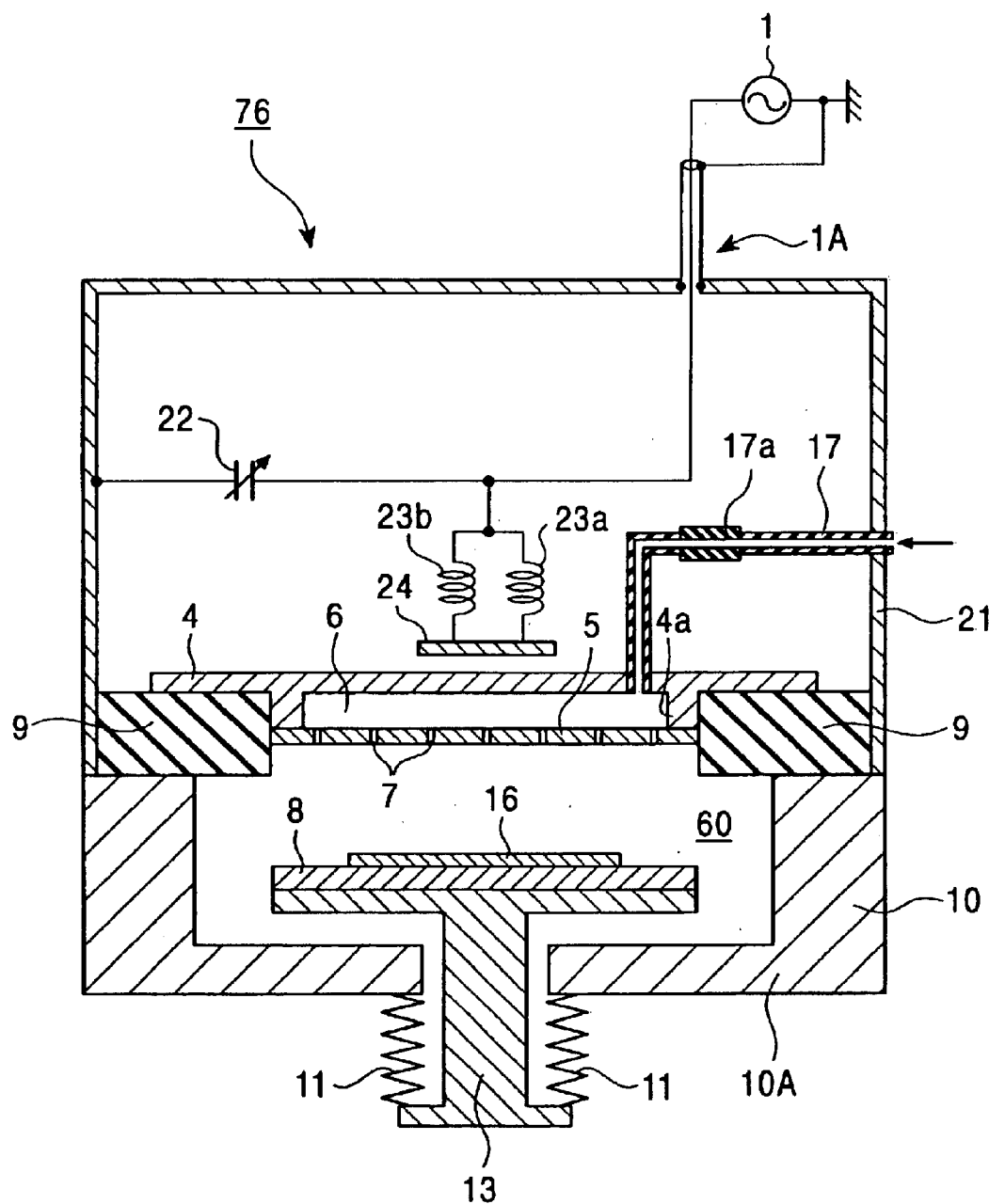
FIG. 12 is a sectional view schematically showing the configuration of a plasma processing apparatus according to a sixth embodiment of the present invention.

FIG. 12 is a sectional view schematically showing the configuration of a plasma processing apparatus according to a sixth embodiment of the present invention.

In the plasma processing apparatus according to the sixth embodiment, a plasma chamber 76 is structured such that a plasma excitation electrode 4 for exciting plasma also functions as one electrode of the tuning capacitor 24 in the matching circuit 2A for matching the impedance with the RF generator 1 in the plasma processing apparatus according to the third embodiment.

Other components are the same as in the third embodiment shown in FIG. 8. Although two inductance coils 23a and 23b are shown, as in the third embodiment, the number of inductance coils may be more than two.

Such a structure of the matching circuit provides an advantage in that the effect of a plurality of inductance coils is maintained in a simplified apparatus, thereby attaining a further reduction in the parasitic RF resistance.

What is claimed is:

1. A plasma processing apparatus comprising:
   a plasma processing chamber that accommodates an electrode pair of a plasma excitation electrode for exciting plasma and a susceptor electrode facing the plasma excitation electrode, a workpiece to be plasma-treated being placed therebetween; and
   a chassis that accommodates an impedance matching circuit, provided in the middle of a supply path for feeding RF power from an RF generator to the plasma excitation electrode, for matching the impedance between the RF generator and the plasma processing chamber, the chassis serving as a return path from the susceptor electrode to the RF generator and further comprising adjusting means for making the chassis impedances axisymmetric about the central axis of the chassis;
   wherein, in the return path in the chassis, impedances are axisymmetrically equal at a predetermined frequency of the RF power with respect to the direction of a current returning to the RF generator.

2. The plasma processing apparatus according to claim 1, wherein the cross-section of the chassis perpendicular to the central axis thereof has a shape of a regular polygon or a circle.

3. The plasma processing apparatus according to claim 2, wherein the RF generator and the impedance matching circuit are connected wit a wiring line of a coaxial cable extending from the center of the top of the chassis to the RF generator.

4. The plasma processing apparatus according to claim 1, wherein the plasma processing chamber has an axisymmetric shape, the central axis thereof being coincident with the axis of symmetry of the impedances of the chassis.

5. The plasma processing apparatus according to claim 4, wherein the susceptor electrode has an axisymmetric shape, the central axis thereof being coincident with the axis of symmetry of the impedances of the chassis.

6. The plasma processing apparatus according to claim 1, wherein the impedances have a specific value at the frequency of the RF power supplied from the RF generator.

7. The plasma processing apparatus according to claim 1, wherein the chassis has an axisymmetric shape about the axis of the plasma excitation electrode accommodated in the plasma processing chamber.

8. The plasma processing apparatus according to claim 1, wherein the chassis is in the shape of a dome about the central axis of the chassis.

9. The plasma processing apparatus according to claim 1, wherein the adjusting means includes at least one of a slot and a fin formed in a sidewall of the chassis.

10. The plasma processing apparatus according to claim 1, wherein the adjusting means includes a plate bonded to the sidewall of the chassis, the plate formed from a different material and having a different impedance than the than the portion of the chassis bonded to.

11. A plasma processing apparatus comprising:
    a plasma processing chamber having an electrode for exciting plasma;
    an RF generator for supplying the electrode with RF power; and
    a matching circuit having an input terminal and an output terminal, for matching the impedance between the plasma processing chamber and the RF generator, the RF generator being connected to the input terminal, the electrode being connected to an RF feeder and the RF feeder being connected to the output terminal, the RF feeder having a central axis
    wherein the matching circuit includes at least two inductance coils electrically connected in parallel, and positioned such that the at least three inductance coils form the vertices of a regularly shaped polygon in a plane perpendicular to the central axis of the RF feeder, the center of the polygon coinciding with the central axis of the RF feeder.

12. The plasma processing apparatus according to claim 11, wherein the matching circuit comprises at least three inductance coils electrically connected in parallel and positioned such that the at least three inductance coils form the vertices of a regularly shaped polygon in a plane perpendicular to the central axis of the RF feeder, the center of the polygon coinciding with the central axis of the RF feeder.

13. The plasma processing apparatus according to claim 11, wherein the inductance coils are axisymmetrically arranged with respect to the center of the electrode.

14. The plasma processing apparatus according to claim 12, wherein the inductance coils are axisymmetrically arranged with respect to the center of the electrode.

15. The plasma processing apparatus according to claim 11, wherein the electrode also serves as an electrode of a tuning capacitor in the matching circuit for matching the impedance with the RF generator.

16. The plasma processing apparatus according to claim 11, wherein the at least three inductance coils are spatially arranged in parallel.

17. The plasma processing apparatus according to claim 11, wherein the RF generator is connected to an RF supplier and the RF supplier is connected to the input terminal.

18. The plasma processing apparatus according to claim 17, further comprising a ground potential portion being connected between the input terminal and the output terminal.

19. A plasma processing apparatus comprising:
    a plasma processing chamber that accommodates an electrode pair of a plasma excitation electrode for exciting plasma and a susceptor electrode facing the plasma excitation electrode, a workpiece to be plasma-treated being placed therebetween; and
    a chassis that accommodates an impedance matching circuit, provided in the middle of a supply path for feeding RF power from an RF generator to the plasma excitation electrode, for matching the impedance between the RF generator and the plasma processing chamber, the chassis having a central axis and serving as a return path from the susceptor electrode to the RF generator, wherein the surfaces of the chassis are formed such that impedances presented on the surface of the chassis in the direction of current returning to the RF generator and at a predetermined frequency of the RF power are axisymmetric with respect to the central axis of the chassis, the formation of the chassis comprising selecting the quality of the material of the chassis to have a uniform impedance with respect to a high frequency current at a predetermined frequency and providing the shape of the chassis such that a cross section of the chassis perpendicular to the central axis of the chassis has a shape of one of a regular polygon or circle.

20. The plasma processing apparatus according to claim 19, wherein an impedance on a surface of the chassis is adjusted by forming a low resistance conductive path on at least a base material of one surface of the chassis such that impedances presented on the surface of the chassis in the direction of current returning to the RF generator and at a predetermined frequency of the RF power.

21. The plasma processing apparatus according to claim 19, wherein an impedance on a surface of the chassis is adjusted by forming a slit in the surface.

22. The plasma processing apparatus according to claim 19, wherein an impedance on a surface of the chassis is adjusted by bonding a conductive component having a different impedance that the base material of the chassis.

* * * * *